US009935611B2

(12) United States Patent
Otagawa et al.

(10) Patent No.: US 9,935,611 B2
(45) Date of Patent: Apr. 3, 2018

(54) ELASTIC WAVE FILTER DEVICE

(71) Applicant: Murata Manufacturing Co., Ltd., Nagaokakyo-shi, Kyoto-fu (JP)

(72) Inventors: Masanori Otagawa, Nagaokakyo (JP); Syunsuke Kido, Nagaokakyo (JP); Hideki Iwamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 70 days.

(21) Appl. No.: 15/265,912

(22) Filed: Sep. 15, 2016

(65) Prior Publication Data

US 2017/0005638 A1 Jan. 5, 2017

Related U.S. Application Data

(63) Continuation of application No. PCT/JP2015/060652, filed on Apr. 3, 2015.

(30) Foreign Application Priority Data

Apr. 11, 2014 (JP) .................................. 2014-082090

(51) Int. Cl.
*H03H 9/64* (2006.01)
*H03H 9/72* (2006.01)
(Continued)

(52) U.S. Cl.
CPC ...... *H03H 9/6489* (2013.01); *H03H 9/02574* (2013.01); *H03H 9/02818* (2013.01);
(Continued)

(58) Field of Classification Search
CPC .. H03H 9/02574; H03H 9/02818; H03H 9/54; H03H 9/64; H03H 9/6483; H03H 9/6489; H03H 9/725
(Continued)

(56) References Cited

U.S. PATENT DOCUMENTS

2008/0042781 A1 2/2008 Kando
2009/0236935 A1* 9/2009 Kando ............... H03H 9/02055
310/313 R
(Continued)

FOREIGN PATENT DOCUMENTS

JP 2002-111443 A 4/2002
JP 2010-062873 A 3/2010
(Continued)

OTHER PUBLICATIONS

English translation of Official Communication issued in corresponding International Application PCT/JP2015/060652, dated May 19, 2015.

*Primary Examiner* — Barbara Summons
(74) *Attorney, Agent, or Firm* — Keating & Bennett, LLP

(57) ABSTRACT

A SAW filter device defines a filter including a high acoustic velocity member, a low acoustic velocity film, a piezoelectric film, and an IDT electrode are stacked in this order. A comb capacitive electrode electrically coupled to the filter is provided on the piezoelectric film. Where $\lambda c$ is a wavelength determined by an electrode finger pitch of the comb capacitive electrode, and, among modes of an elastic wave generated by the comb capacitive electrode, $V_{C-(P+SV)}$ is an acoustic velocity of a P+SV wave, $V_{C-SH}$ is an acoustic velocity of a SH wave, and $V_{C-HO}$ is an acoustic velocity of, out of higher-order modes of a SH wave, a higher-order mode at the lowest frequency side, $V_{C-(P+SV)} < V_{C-SH} < V_{C-HO}$. Where $f_{F-L}$ is a cutoff frequency on a lower frequency side of the filter, $f_{F-H}$ is a cutoff frequency on a higher frequency side, and Euler angles (0°, θ, ψ) represent a propagation direction, with respect to a crystal of the piezoelectric film, of an elastic wave generated by the comb capacitive electrode, given any θ and ψ, $V_{C-(P+SH)}/\lambda_C < f_{F-L}$ and $V_{C-SH}/\lambda_C > f_{F-H}$, or $V_{C-SH}/\lambda_C < f_{F-L}$ and $V_{C-HO}/\lambda_C > f_{F-H}$.

16 Claims, 12 Drawing Sheets

(51) Int. Cl.
 *H03H 9/02* (2006.01)
 *H03H 9/54* (2006.01)
(52) U.S. Cl.
 CPC ............ *H03H 9/54* (2013.01); *H03H 9/6483* (2013.01); *H03H 9/725* (2013.01)
(58) Field of Classification Search
 USPC ......... 333/193–195, 133; 310/313 A, 313 B, 310/313 D
 See application file for complete search history.

(56) References Cited

U.S. PATENT DOCUMENTS

| | | | |
|---|---|---|---|
| 2014/0218128 A1 | 8/2014 | Fujita | |
| 2015/0028720 A1* | 1/2015 | Kando | .................... H03H 9/25 310/313 A |
| 2015/0033521 A1 | 2/2015 | Watanabe et al. | |
| 2015/0102705 A1 | 4/2015 | Iwamoto et al. | |

FOREIGN PATENT DOCUMENTS

| | | |
|---|---|---|
| WO | 2006/123518 A1 | 11/2006 |
| WO | 2012/086639 A1 | 6/2012 |
| WO | 2012/114593 A1 | 8/2012 |
| WO | 2013/061694 A1 | 5/2013 |
| WO | 2013/191122 A1 | 12/2013 |

* cited by examiner

ELASTIC WAVE FILTER DEVICE

CROSS REFERENCE TO RELATED APPLICATIONS

This application claims the benefit of priority to Japanese Patent Application 2014-082090 filed Apr. 11, 2014 and is a Continuation Application of PCT/JP2015/060652 filed on Apr. 3, 2015. The entire contents of each of these applications are hereby incorporated by reference.

BACKGROUND OF THE INVENTION

1. Field of the Invention

The present invention relates to a band-pass elastic wave filter device, and more particularly to an elastic wave filter device including a low acoustic velocity film, a piezoelectric film, and an IDT electrode that are stacked on a high acoustic velocity member.

2. Description of the Related Art

WO12/086639 discloses a surface acoustic wave (SAW) filter formed by stacking, on a support substrate, an AlN film, a $SiO_2$ film, a $LiTaO_3$ film, and an IDT electrode predominantly made of Al. The $SiO_2$ film, which is a low acoustic velocity film, is stacked between the AlN film, which is a high acoustic velocity film, and the $LiTaO_3$ film, which is a piezoelectric film. This enables achieving higher frequencies and increases the Q value.

In contrast, WO12/114593 discloses a duplexer using a SAW filter. In a transmission filter of the duplexer, a comb capacitive electrode is connected as a bridging capacitance to a SAW resonator.

WO06/123518 discloses a boundary acoustic wave filter device. In the boundary acoustic wave device, a comb capacitive electrode is connected to a boundary acoustic wave filter. In this case, where Vm is the acoustic velocity of a boundary acoustic wave and Vc is the acoustic velocity of a slower transversal wave, out of the acoustic velocities of slow transversal waves in first and second media, in a direction orthogonal to a direction in which the electrode fingers of the comb capacitive electrode extend, $Vm/\lambda m < Vc/\lambda c$. Note that $\lambda m$ is the wavelength of a boundary acoustic wave, and $\lambda c$ is the wavelength of the above-mentioned slower transversal wave.

If a comb capacitive electrode such as that described in WO12/114593 is provided in the SAW filter with the multilayer structure described in WO12/086639, it has been discovered that undesired spurious responses occur in the passband of the SAW filter.

In WO06/123518, the influence of boundary acoustic waves generated by the comb electrode is merely suppressed in the boundary acoustic wave device, but is not suppressed in a SAW device. It is also necessary to increase $Vc/\lambda c$. Thus, the pitch between the electrode fingers of the comb electrode becomes very small. Therefore, it is very difficult to manufacture the comb capacitive electrode.

SUMMARY OF THE INVENTION

Preferred embodiments of the present invention provide an easy-to-manufacture elastic wave filter device that is not vulnerable to influences of spurious responses caused by a comb capacitive electrode.

An elastic wave filter device according to a preferred embodiment of the present invention includes a high acoustic velocity member; a low acoustic velocity film stacked on the high acoustic velocity member; a piezoelectric film stacked on the low acoustic velocity film; an IDT electrode provided on the piezoelectric film and defining a filter; and a comb capacitive electrode provided on the piezoelectric film and electrically coupled to the filter.

In a preferred embodiment of the present invention, an acoustic velocity of a bulk wave propagating in the high acoustic velocity member is higher than an acoustic velocity of a bulk wave propagating in the piezoelectric film, and an acoustic velocity of a bulk wave propagating in the low acoustic velocity film is lower than an acoustic velocity of a bulk wave propagating in the piezoelectric film.

$\lambda c$ is a wavelength determined by an electrode finger pitch of the comb capacitive electrode. Among modes of an elastic wave generated by the comb capacitive electrode, $V_{C-(P+SV)}$ is an acoustic velocity of a P+SV wave, $V_{C-SH}$ is an acoustic velocity of a SH wave, and $V_{C-HO}$ is an acoustic velocity of, out of higher-order modes of a SH wave, a higher-order mode positioned at a lowest frequency side, and $V_{C-(P+SV)} < V_{C-SH} < V_{C-HO}$.

In a preferred embodiment of the present invention, where $f_{F-L}$ is a cutoff frequency on a lower frequency side of the filter, $f_{F-H}$ is a cutoff frequency on a higher frequency side, and Euler angles $(0°, \theta, \psi)$ represent a propagation direction, with respect to a crystal of the piezoelectric film, of an elastic wave generated by the comb capacitive electrode, given any $\theta$ and $\psi$, $V_{C-(P+SH)}/\lambda_C < f_{F-L}$ and $V_{C-SH}/\lambda_C > f_{F-H}$, or $V_{C-SH}/\lambda_C < f_{F-L}$ and $V_{C-HO}/\lambda_C > f_{F-H}$.

In an elastic wave filter device according to a preferred embodiment of the present invention, $\psi$ of the Euler angles, the Euler angles being a propagation orientation of an elastic wave generated by the comb capacitive electrode, is preferably within a range from about 86° to about 94° inclusive, for example.

In an elastic wave filter device according to a preferred embodiment of the present invention, more preferably $V_{C-(P+SV)}/\lambda_C < f_{F-L}$ and $V_{C-HO}/\lambda_C > f_{F-H}$.

In an elastic wave filter device according to a preferred embodiment of the present invention, the high acoustic velocity member is a high acoustic velocity film, and the elastic wave filter device further includes a support substrate with an upper surface on which the high acoustic velocity film is stacked.

In an elastic wave filter device according to a preferred embodiment of the present invention, the high acoustic velocity member includes a high acoustic velocity substrate.

In an elastic wave filter device according to a preferred embodiment of the present invention, the comb capacitive electrode includes a pair of busbars facing each other; and the IDT electrode includes a first IDT electrode spaced by a gap from the comb capacitive electrode in a direction in which the busbars extend. The first IDT electrode includes a pair of busbars facing each other; and where an inclination angle of the first IDT electrode is an angle defined by a propagation direction of an elastic wave in the first IDT electrode and the busbars and X° is the inclination angle of the first IDT electrode, $\psi$ of the Euler angles, the Euler angles being a propagation orientation of an elastic wave generated by the comb capacitive electrode, is within a range from about (90°+X°−5°) to about (90°+X°+5°) inclusive, for example.

In an elastic wave filter device according to a preferred embodiment of the present invention, the busbars of the comb capacitive electrode extend in a direction perpendicular or substantially perpendicular to the propagation direction of an elastic wave in the first IDT electrode.

In an elastic wave filter device according to a preferred embodiment of the present invention, the IDT electrode includes a second IDT electrode connected to the first IDT electrode, and the second IDT electrode includes a pair of busbars facing each other, the pair of busbars extending in a direction parallel or substantially parallel to the busbars of the first IDT electrode. The second IDT electrode is located at a side of the comb capacitive electrode.

According to various preferred embodiments of the present invention, in elastic wave filter devices including the high acoustic velocity member, the low acoustic velocity film, and the piezoelectric film that are stacked, spurious responses based on vibration modes generated by the comb capacitive electrode are less likely to occur within the passband. It is also easy to form the comb capacitive electrode. Accordingly, highly productive elastic filter devices with excellent filter characteristics are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Figure 1:
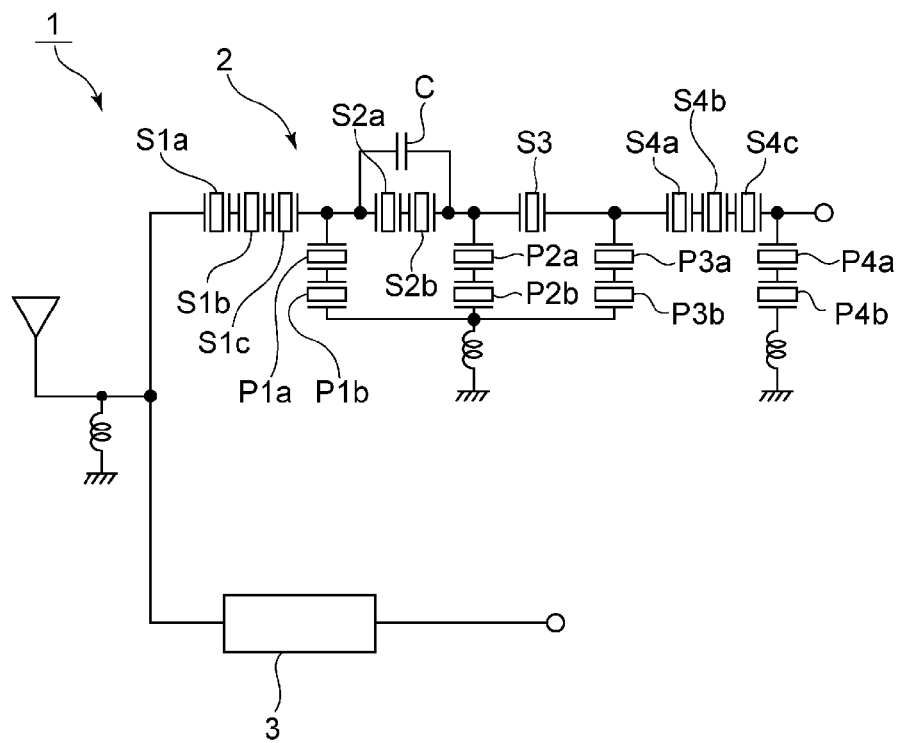
FIG. 1 is a circuit diagram of a duplexer with a SAW filter device according to a preferred embodiment of the present invention.

FIG. 1 is a circuit diagram of a duplexer including a SAW filter device according to a preferred embodiment of the present invention. A duplexer 1 includes a SAW filter device 2, which defines a transmission filter, and a reception filter 3. The SAW filter device 2, which defines a transmission filter, is a SAW filter according to a preferred embodiment of the present invention.

The SAW filter device 2 preferably has a ladder circuit configuration, although the configuration is not particularly limited to this type. That is, the SAW filter device 2 includes a plurality of series arm resonators S1a to S1c, S2a, S2b, S3, and S4a to S4c, and parallel arm resonators P1a, P1b to P4a, and P4b. A bridging capacitance C is connected in parallel to the series arm resonators S2a and S2b.

The series arm resonators S1a to S4c and the parallel arm resonators P1a to P4b are defined by SAW resonators. The bridging capacitance C is defined by a comb capacitive electrode, as will be described later.

Figure 2:
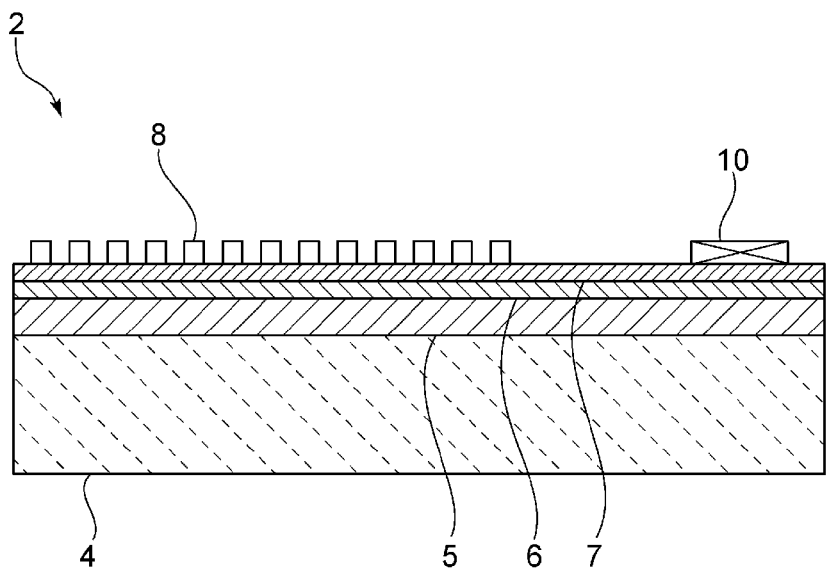
FIG. 2 is an elevational cross-sectional view that schematically illustrates the structure of a SAW filter device according to a preferred embodiment of the present invention.

FIG. 2 is an elevational cross-sectional view that schematically illustrates the specific structure of the SAW filter device 2.

The SAW filter device 2 includes a support substrate 4. The support substrate 4 is preferably made of a LiTaO₃ substrate in the present preferred embodiment. The material used for the support substrate 4 is not particularly limited, and the support substrate 4 can be made using an appropriate insulator, piezoelectric material, semiconductor, for example.

A high acoustic velocity film 5 is stacked on the support substrate 4. A low acoustic velocity film 6 is stacked on the high acoustic velocity film 5. A piezoelectric film 7 is stacked on the low acoustic velocity film 6. An IDT electrode 8 is provided on the piezoelectric film 7 so as to define SAW resonators. That is, the IDT electrode 8 is included in the above-mentioned SAW resonators of the SAW filter device 2.

Meanwhile, a schematically illustrated comb capacitive electrode 10 is provided on the piezoelectric film 7, at a distance from the IDT electrode 8. The comb capacitive electrode 10 defines the bridging capacitance C.

The high acoustic velocity film 5 is preferably made of AlN in the present preferred embodiment. The acoustic velocity of a bulk wave propagating in the high acoustic velocity film 5 is higher than the acoustic velocity of a bulk wave propagating in the piezoelectric film 7. As long as such a relationship is satisfied, the high acoustic velocity film 5 is not limited to AlN, and the high acoustic velocity film 5 can be made using an appropriate insulator or semiconductor, for example.

The low acoustic velocity film 6 is preferably made of $SiO_2$ in the present preferred embodiment. The acoustic velocity of a bulk wave propagating in the low acoustic velocity film 6 is lower than the acoustic velocity of a bulk wave propagating in the piezoelectric film 7. As long as such a relationship is satisfied, the low acoustic velocity film 6 can be made using, for example, an appropriate insulator or semiconductor, other than $SiO_2$.

The piezoelectric film 7 is preferably made of, for example, a 50°-rotated Y cut $LiTaO_3$ film in the present preferred embodiment. However, the piezoelectric film 7 is not limited to $LiTaO_3$, and the piezoelectric film 7 can be made using an appropriate piezoelectric single crystal such as $LiNbO_3$, for example.

The IDT electrode 8 and the comb capacitive electrode 10 are preferably made of Al, for example. Needless to say, an appropriate alloy primarily made of Al may be used. Alternatively, a metal other than Al or an alloy made of a metal than Al may be used. In addition, a metal may be stacked.

A structure in which the high acoustic velocity film 5, the low acoustic velocity film 6, and the piezoelectric film 7 are stacked enables easily achieving higher frequencies and increases the Q value, as described in WO12/086639.

At the same time, the filter characteristics of the SAW filter device 2 are improved by connecting the bridging capacitance C illustrated in FIG. 1.

Figure 3:
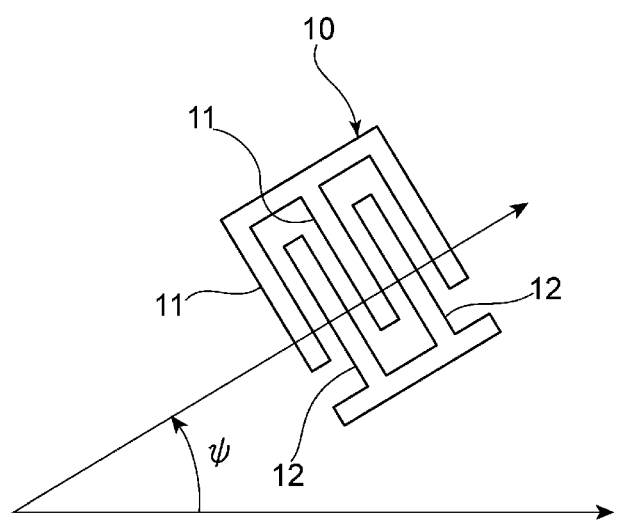
FIG. 3 is a schematic diagram illustrating a propagation orientation ψ at a comb capacitive electrode.

The comb capacitive electrode 10, which defines the bridging capacitance C, excites an undesired SAW. As illustrated in FIG. 3, the comb capacitive electrode 10 includes a plurality of electrode fingers 11 coupled to one of two potentials, and a plurality of electrode fingers 12 coupled to the other potential.

λc denotes a wavelength determined by the electrode finger pitch of the comb capacitive electrode 10. Among modes of a SAW generated by the comb capacitive electrode, $V_{C-(P+SV)}$ denotes the acoustic velocity of a P+SV wave, $V_{C-SH}$ denotes the acoustic velocity of a SH wave, and $V_{C-HO}$ denotes the acoustic velocity of, out of higher-order modes of an SH wave, a higher-order mode positioned at the lowest frequency side. In this case, $V_{C-(P+SV)} < V_{C-SH} < V_{C-HO}$. Note that P+SV waves in the present preferred embodiment are Rayleigh waves.

In the passband of the SAW filter device 2, that is, the passband of a band-pass filter defined by the IDT electrode 8, $f_{F-L}$ denotes the cutoff frequency on the lower frequency side, and $f_{F-H}$ denotes the cutoff frequency on the higher frequency side. The propagation orientation of a SAW generated by the comb capacitive electrode 10 is represented by the Euler angles (0°, θ, ψ) with respect to the crystal of the piezoelectric film 7. In the present preferred embodiment, θ=−40°. Also, as illustrated in FIG. 3, ψ represents a direction orthogonal to the electrode fingers 11 and 12 of the comb capacitive electrode 10. Given any θ and ψ, $V_{C-(P+SV)}/\lambda_C < f_{F-L}$ and $V_{C-SH}/\lambda_C > f_{F-H}$, or $V_{C-SH}/\lambda_C < f_{F-L}$ and $V_{C-HO}/\lambda_C > f_{F-H}$.

Since "$V_{C-(P+SV)}/\lambda_C < f_{F-L}$ and $V_{C-SH}/\lambda_C > f_{F-H}$" or "$V_{C-SH}/\lambda_C < f_{F-L}$ and $V_{C-HO}/\lambda_C > f_{F-H}$" in the SAW filter device 2 according to the present preferred embodiment, a spurious response of each mode of a SAW excited by the comb capacitive electrode 10 is less likely to occur within the passband of the SAW filter device 2. Therefore, the filer characteristics are significantly improved. It is also unnecessary to significantly reduce the electrode finger pitch of the comb capacitive electrode 10. Therefore, the comb capacitive electrode 10 is easily formed, thus increasing the productivity of the SAW filter device 2. This will be described in more detail below.

Figure 4A:
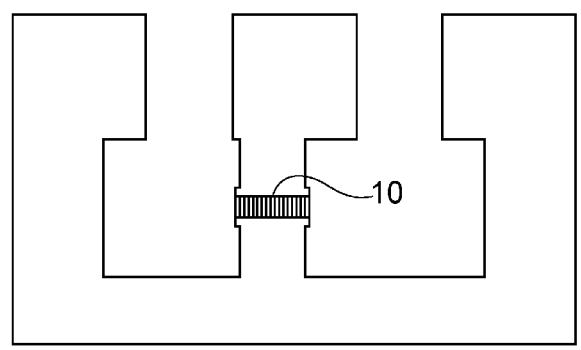
FIG. 4A is a schematic plan view of an electrode structure in a case in where the propagation orientation ψ at the comb capacitive electrode is 0°.

FIG. 4A is a schematic plan view of the electrode structure of the SAW filter device 2 in a case where the propagation orientation of a SAW at the comb capacitive electrode 10 is (0°, −40°, 0°).

Figure 5A:
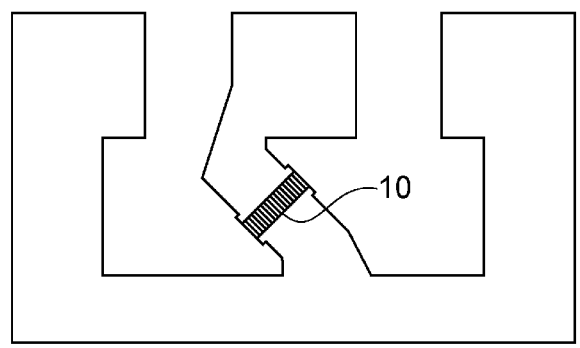
FIG. 5A is a schematic plan view of an electrode structure in a case where the propagation orientation ψ at the comb capacitive electrode is 45°.
Figure 6A:
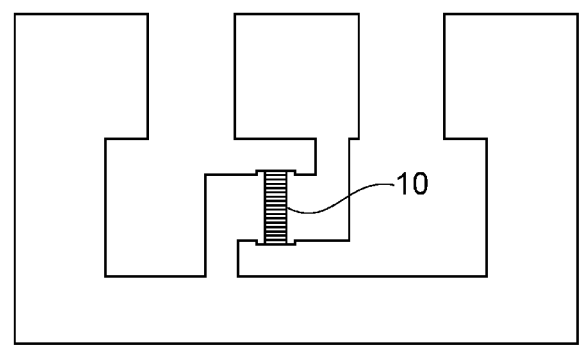
FIG. 6A is a schematic plan view of an electrode structure in a case where the propagation orientation ψ at the comb capacitive electrode is 90°.

In FIG. 4A, ψ at the comb capacitive electrode 10 is about 0°, for example. In FIG. 5A, it is assumed that ψ at the comb capacitive electrode 10 is about 45°, for example. In FIG. 6A, ψ is about 90°, for example.

Note that FIGS. 4A, 5A, and 6A schematically illustrate the comb capacitive electrode 10 of the SAW filter device 2, and wiring patterns connected to the comb capacitive electrode 10.

The SAW filter device 2 including each comb capacitive electrode at which the propagation orientation ψ is about 0°, about 45°, or about 90°, for example, is designed as follows.

Electrode thickness=about 160 nm

Thickness of piezoelectric film 7=about 500 nm

Thickness of low acoustic velocity film 6=about 700 nm

Thickness of high acoustic velocity film 5=about 1340 nm thickness of support substrate 4=about 350 μm wavelength determined by electrode finger pitch of comb capacitive electrode 10=about 1.8 μm.

Figure 4B:
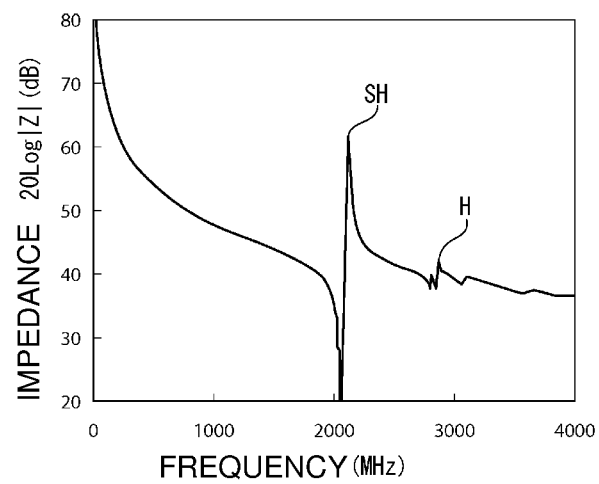
FIG. 4B is a diagram illustrating the impedance-frequency characteristics of the comb capacitive electrode.
Figure 5B:
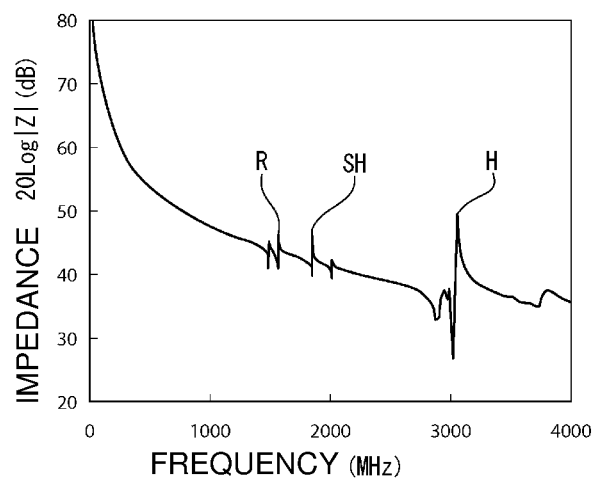
FIG. 5B is a diagram illustrating the impedance-frequency characteristics of the comb capacitive electrode.
Figure 6B:
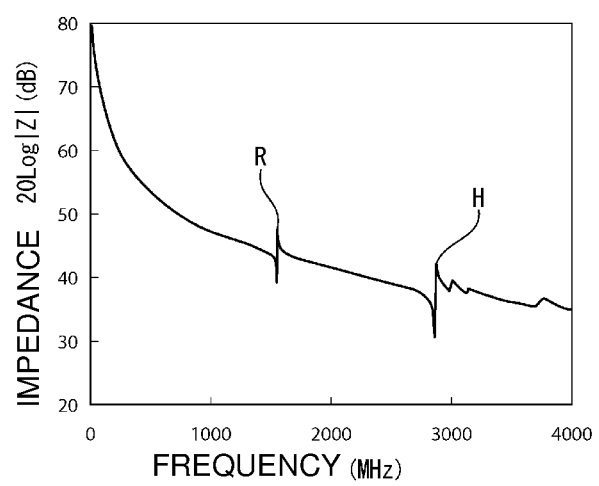
FIG. 6B is a diagram illustrating the impedance-frequency characteristics of the comb capacitive electrode.

FIGS. 4B, 5B, and 6B illustrate the impedance-frequency characteristics of the respective comb capacitive electrodes. In FIG. 4B, a response SH of the fundamental mode of a SH wave and a response H of the higher-order mode appear.

In FIG. 5B, a response R of a Rayleigh wave, a response SH of the fundamental mode of a SH wave, and a response H of the higher-order mode appear.

In FIG. 6B, since the propagation orientation ψ is about 90°, for example, no influence of the fundamental mode of a SH wave is present, and a response R of a Rayleigh wave and a response H of the higher-order mode appear.

As has been described above, even when the propagation orientation is changed among about 0°, about 45°, and about 90°, since the comb capacitive electrode 10 includes the plurality of interdigitated electrode fingers 11 and 12, each mode of a SAW is excited.

Figure 7:
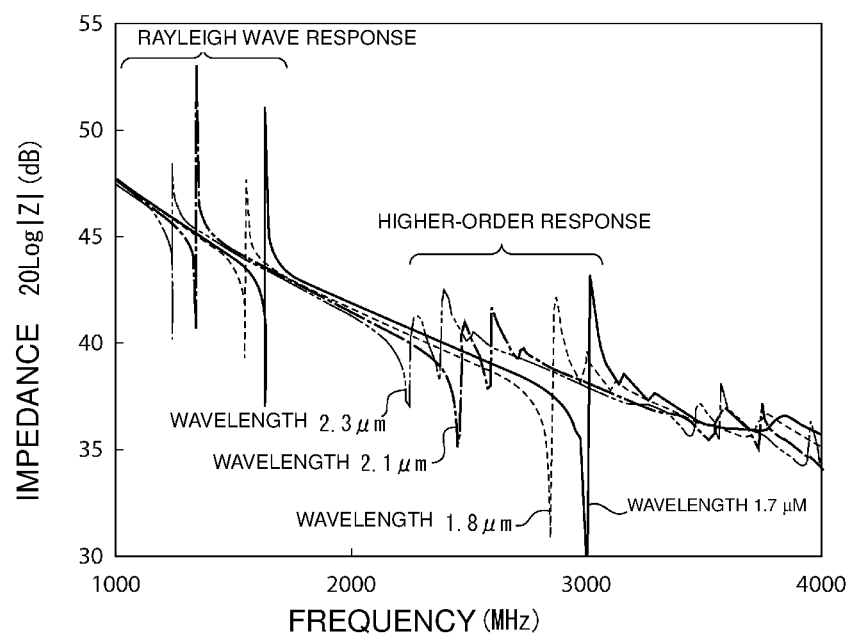
FIG. 7 is a diagram illustrating changes in the impedance-frequency characteristics in a case where a wavelength determined by the electrode finger pitch of the comb capacitive electrode is changed.

In contrast, FIG. 7 is a diagram illustrating the impedance-frequency characteristics in a case where the wavelength determined by the electrode finger pitch is changed among about 1.7 μm, about 1.8 μm, about 2.1 μm, and about 2.3 μm in a configuration where the propagation orientation at the comb capacitive electrode 10 is about 90°, for example. As is clear from FIG. 7, a response of the fundamental wave of a SH wave does not appear in the case where the propagation orientation ψ is about 90°, for example.

Also, it is clear that a response of a Rayleigh wave and a response of the higher-order mode appear even when the wavelength is changed as described above. The shorter the wavelength at the comb capacitive electrode 10, that is, the smaller the electrode finger pitch, the more the responses are shifted toward the higher frequency side.

As is clear from FIGS. 4A to 7, each mode of a SAW is excited by the comb capacitive electrode 10.

When the piezoelectric film 7 is a rotated Y-cut LiTaO$_3$ or LiNbO$_3$, three modes of a SAW generated by the structure according to the present preferred embodiment occur, namely, the mode of a Rayleigh wave, i.e., the mode of a longitudinal wave+SV wave, the mode of the fundamental wave of a SH wave, and the higher-order mode of a SH wave, as has been described above. Note that a plurality of higher-order modes occur on the higher frequency side. These higher-order modes have various acoustic velocities and band width ratios. Furthermore, how the higher-order modes appear varies depending on the material and thickness of each layer configuring the multilayer structure. In the present preferred embodiment, among a plurality of higher-order modes that occur, a mode having a magnitude that is not negligible as a spurious response and being positioned at the lowest frequency side will be referred to as a higher-order mode hereinafter. This "magnitude that is not negligible" refers to a response that is about 0.01% or greater in band width ratio. In addition, the fact that only a higher-order mode that occurs at the lowest frequency side is treated is because the passband is positioned at frequencies lower than the higher-order mode.

Note that the band width ratio BW is a value obtained by BW={(anti-resonant frequency–resonant frequency)}/resonant frequency×100 (%).

In the present preferred embodiment, given any θ and ψ, the wavelength λc at the comb capacitive electrode 10 is determined so as to satisfy one of the following conditions: condition 1: [$V_{C-(P+SV)}/\lambda_C < f_{F-L}$ and $V_{C-SH}/\lambda_C > f_{F-H}$] and condition 2 [$V_{C-SH}/\lambda_C < f_{F-L}$ and $V_{C-HO}/\lambda_C > f_{F-H}$]. Thus, a spurious response of a SAW generated by the comb capacitive electrode 10 does not occur within the passband. That is, as illustrated in FIG. 7, when the wavelength λc at the comb capacitive electrode 10 is changed, the frequency position of each mode generated by the comb capacitive electrode 10 changes. Therefore, by selecting the wavelength λc at the comb capacitive electrode 10 so as to satisfy the condition 1 or the condition 2, a spurious response of a SAW generated by the comb capacitive electrode 10 is able to be positioned outside the passband of the filter. More specifically, since the condition 1 states that $V_{C-(P+SV)}/\lambda_C < f_{F-L}$, a response of a Rayleigh wave generated by the comb capacitive electrode 10 is positioned at a frequency lower than the cutoff frequency on the lower frequency side of the passband. Thus, a response of a Rayleigh wave neither becomes a spurious response nor appears within the passband. Since $V_{C-SH}/\lambda_C > f_{F-H}$, a response of the fundamental wave of a SH wave generated by the comb capacitive electrode 10 is positioned at a frequency higher than the cutoff frequency $f_{F-H}$ on the higher frequency side of the passband. Thus, a response of the fundamental wave of a SH wave neither becomes a spurious response nor appears within the passband. Since a response of the higher-order mode is a frequency higher than the above, this response does not appear within the passband.

Since the condition 2 states that $V_{C-SH}/\lambda_C < f_{F-L}$, a response of the fundamental wave of a SH wave generated by the comb capacitive electrode 10 is positioned at a frequency lower than the passband. Since a response of a Rayleigh wave generated by the comb capacitive electrode 10 is positioned at a frequency lower than a response of the fundamental wave of a SH wave, the response of a Rayleigh wave neither becomes a spurious response nor appears within the passband. Since $V_{C-HO}/\lambda_C > f_{F-H}$, a response of the higher-order mode generated by the comb capacitive electrode 10 is positioned at a frequency higher than the cutoff frequency $f_{F-H}$ on the higher frequency side of the passband. Thus, no spurious response of the higher-order mode appears within the passband.

As has been described above, under the condition 1, a response of a Rayleigh wave is positioned at a lower frequency side of the passband of the band-pass filter, that is, the passband of the SAW filter device 2, and a response of a SH wave is positioned at a frequency higher than the passband. Under the condition 2, a response of a SH wave is positioned at a frequency lower than the passband, and a response of the higher-order mode is positioned at a frequency higher than the passband. In doing so, the influence of spurious responses of the modes generated by the comb capacitive electrode 10 becomes less likely to occur within the passband.

In the SAW filter device 2 according to the present preferred embodiment, a spurious response of each mode of a SAW generated by the comb capacitive electrode 10 is less likely to appear within the passband. In WO06/123518 described above, since Vm/λm<Vc/λc, the wavelength λc determined by the comb capacitive electrode must be small, that is, the electrode finger pitch must be small. Therefore, it is difficult to easily and stably define the comb capacitive electrode 10.

In contrast, in the present preferred embodiment, since it is only necessary that the wavelength λc at the comb capacitive electrode 10 satisfy the condition 1 or the condition 2, the electrode finger pitch is able to be larger than that in the configuration described in WO06/123518. Therefore, the comb capacitive electrode 10 is easily formed, thus increasing the productivity of the SAW filter device 2.

Figure 8:
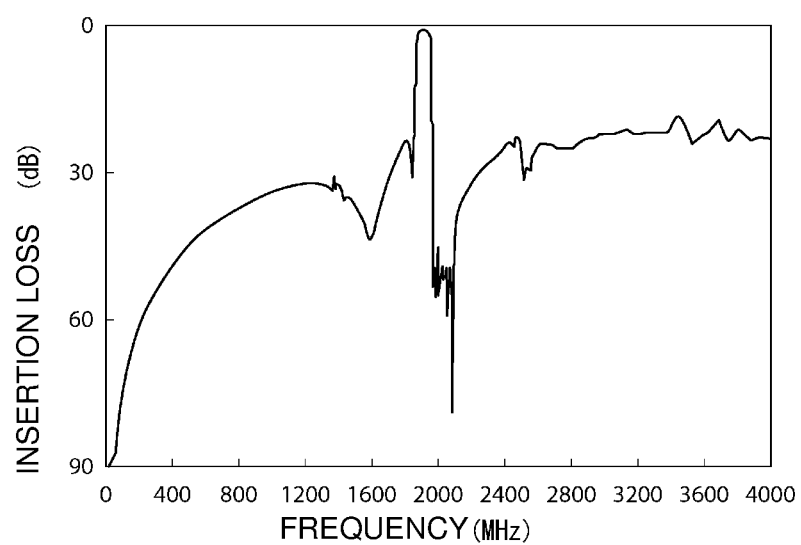
FIG. 8 is a diagram illustrating the filter characteristics of the SAW filter device according to a preferred embodiment of the present invention.

FIG. 8 is a diagram illustrating the filter characteristics of the SAW filter device 2 according to a preferred embodiment of the present invention. The impedance-frequency characteristics of the comb capacitive electrode 10 are those illustrated in FIG. 9. That is, it is assumed that ψ of the Euler angles at the comb capacitive electrode 10 is, for example, about 90°, and the wavelength λc is, for example, about 2.2 μm, for example. Accordingly, the SAW filter device 2 is a transmission filter of the duplexer 1 illustrated in FIG. 1. This duplexer is a Band 2 duplexer, and the passband of the SAW filter device 2 defining a transmission filter ranges, for example, from about 1850 MHz to about 1910 MHz.

In the present preferred embodiment, the acoustic velocity $V_{C-(P+SV)}$ of a Rayleigh wave is, for example, about 2700 m/sec, and the acoustic velocity $V_{C-HO}$ of the higher-order mode is, for example, about 5170 m/sec. The cutoff frequency $f_{F-L}$ on the lower frequency side of the Band 2 passband is, for example, about 1850 MHz, and the cutoff frequency $f_{F-H}$ on the higher frequency side is, for example, about 1910 MHz. Therefore, it is suitable to set 1.46<λc<2.70 (μm) in the present preferred embodiment. In the above-described filter device, λc=2.2 μm, for example.

Figure 9:
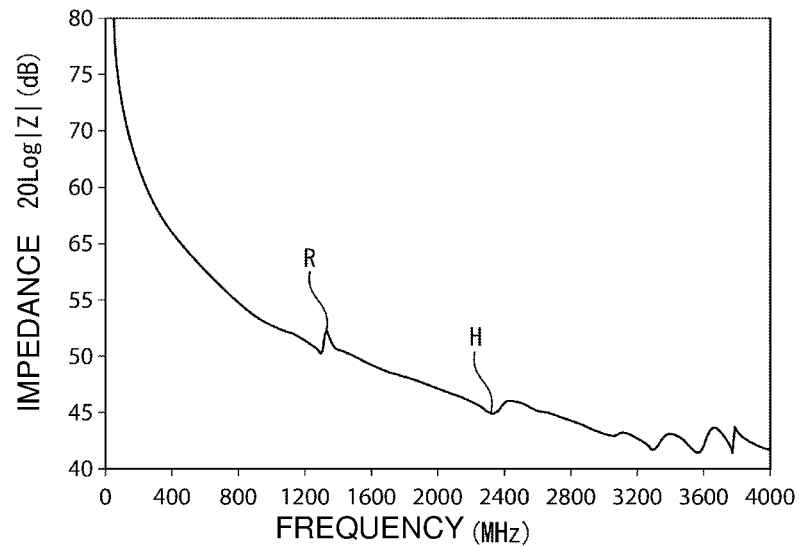
FIG. 9 is a diagram illustrating the impedance-frequency characteristics of a single comb capacitive electrode used in a SAW filter device with filter characteristics illustrated in FIG. 12.

Meanwhile, FIG. 9 illustrates the impedance-frequency characteristics of a single comb capacitive electrode used in the SAW filter device 2. As is clear from FIG. 9, a response R of a Rayleigh wave appears near 1300 MHz and a response of the higher-order mode appears near 2350 MHz, but no response of the fundamental wave of a SH wave appears. Thus, it is clear that, in the filter characteristics illustrated in FIG. 8, a response of each mode excited by the comb capacitive electrode 10 does not become a spurious response within the passband.

Figure 10:
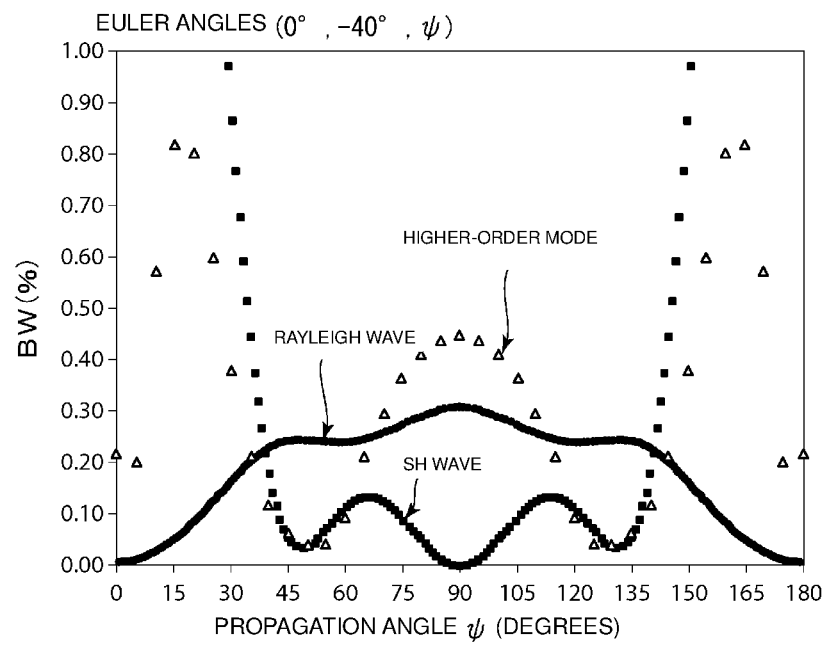
FIG. 10 is a diagram illustrating changes in the band width ratio BW of each mode generated by a comb capacitive electrode in a case where θ of the Euler angles is −40° and the propagation orientation ψ is changed.
Figure 11:
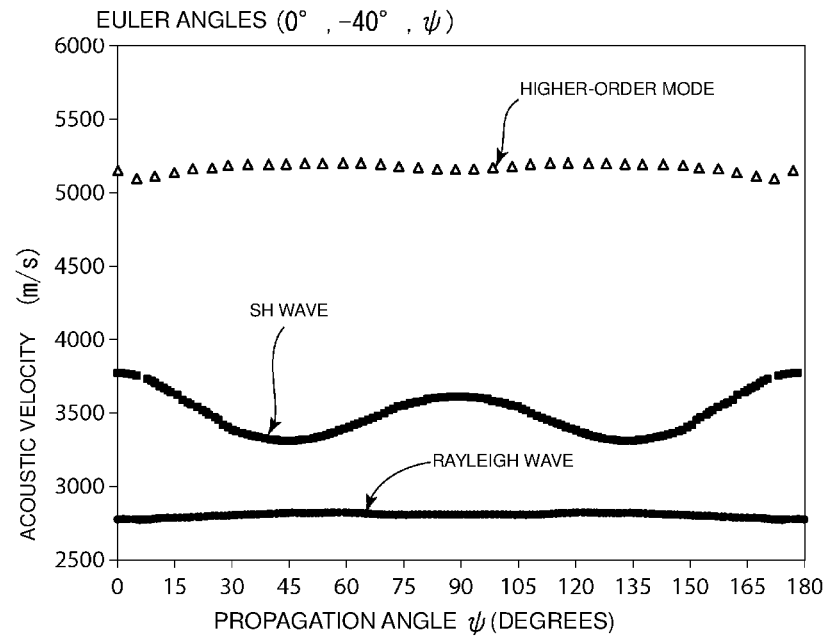
FIG. 11 is a diagram illustrating changes in the acoustic velocity of each mode generated by the comb capacitive electrode in a case where θ of the Euler angles is −40° and the propagation orientation ψ is changed.

In the structure according to a preferred embodiment of the present invention, the band width ratio BW (%) and acoustic velocity of each mode are obtained while fixing θ of the Euler angles to about −40° and changing the propagation orientation ψ at the comb capacitive electrode. The results are illustrated in FIGS. 10 and 11. FIG. 10 is a diagram illustrating changes in the band width ratio BW (%) of each mode in a case where the propagation orientation ψ at the comb capacitive electrode 10 is changed. FIG. 11 is a diagram illustrating changes in the acoustic velocity of each mode in the case where the propagation orientation ψ is changed.

Figure 12:
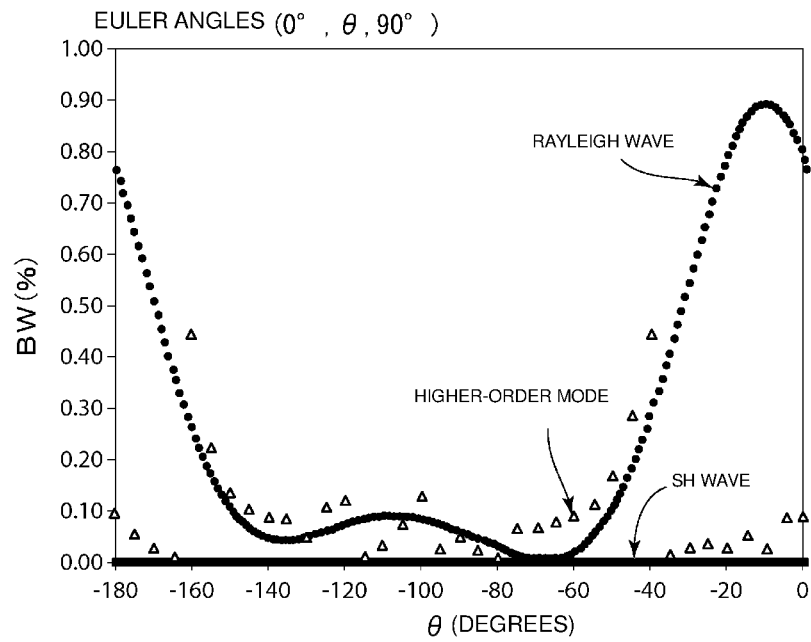
FIG. 12 is a diagram illustrating changes in the band width ratio BW of each vibration mode at the comb capacitive electrode in a case where θ is changed while the propagation orientation ψ is set to 90°.
Figure 13:
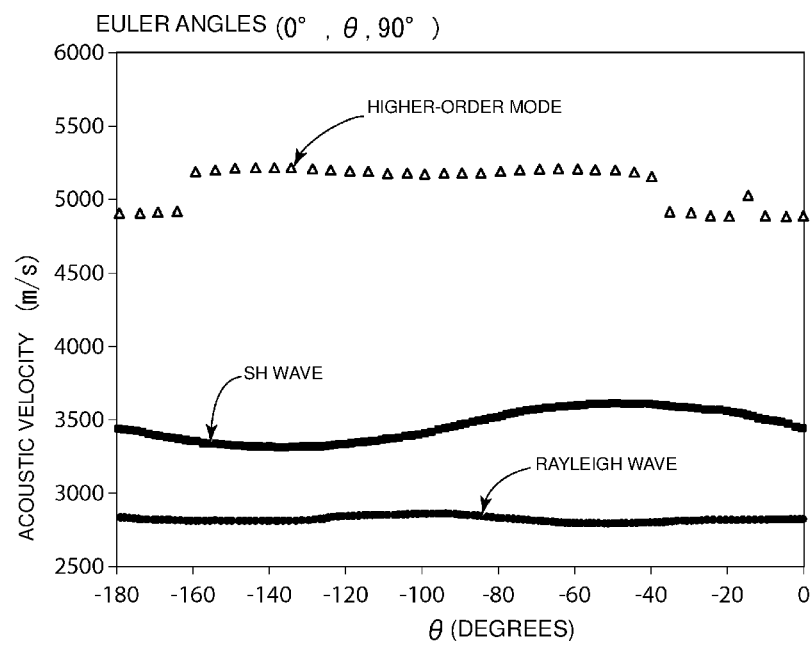
FIG. 13 is a diagram illustrating changes in the acoustic velocity of each vibration mode at the comb capacitive electrode in a case where θ is changed while the propagation orientation ψ is set to 90°.

FIG. 12 is a diagram illustrating changes in the band width ratio BW (%) of each mode in a case where the propagation orientation ψ is fixed to about 90° and θ of the Euler angles is changed, and FIG. 13 is a diagram illustrating changes in the acoustic velocity. In FIGS. 10 to 13, data indicated by a circle is the mode of a Rayleigh wave, data indicated by a square is the mode of a SH wave, and data indicated by a white triangle is the higher-order mode.

FIGS. 10 and 11 clarify that the band width ratio BW of each mode changes when the propagation orientation ψ changes, but the acoustic velocity is always $V_{C-(P+SV)} < V_{C-SH} < V_{C-HO}$.

As is clear from FIGS. 12 and 13, even when θ is changed, similarly the relationship $V_{C-(P+SV)} < V_{C-SH} < V_{C-HO}$ holds true.

As is clear from FIGS. 10 and 12, given any θ, when ψ is within the range of about 90°±4°, that is, when ψ ranges from about 86° to about 94° inclusive, the band width ratio BW of the fundamental wave of a SH wave is less than or equal to about 0.01%, for example. Therefore, it is preferable that ψ range from about 86° to about 94° inclusive, for example. Accordingly, a response of the fundamental wave of a SH wave can be ignored.

In this case, it is only necessary to select the wavelength λc so as to satisfy the conditions $V_{C-(P+SV)}/\lambda_C < f_{F-L}$ and $V_{C-HO}/\lambda_C > f_{F-H}$. Accordingly, the influence of spurious responses generated by the comb capacitive electrode 10 is able to be reliably prevented.

Although the SAW filter device 2 preferably has a ladder circuit configuration in the above-described preferred embodiments, the circuit configuration of a SAW filter device according to a preferred embodiment of the present invention is not particularly restricted. That is, the circuit configuration is not limited to the ladder circuit configuration, and preferred embodiments of the present invention are applicable to a SAW filter device with various circuit configurations including a longitudinally coupled resonator-type and a lattice-type, for example. In this case, the comb capacitive electrode is not limited to one that functions as the above-described bridging capacitance C. That is, preferred embodiments of the present invention are widely applicable to a configuration in which an electrostatic capacitance is connected to a band-pass filter.

Figure 14:
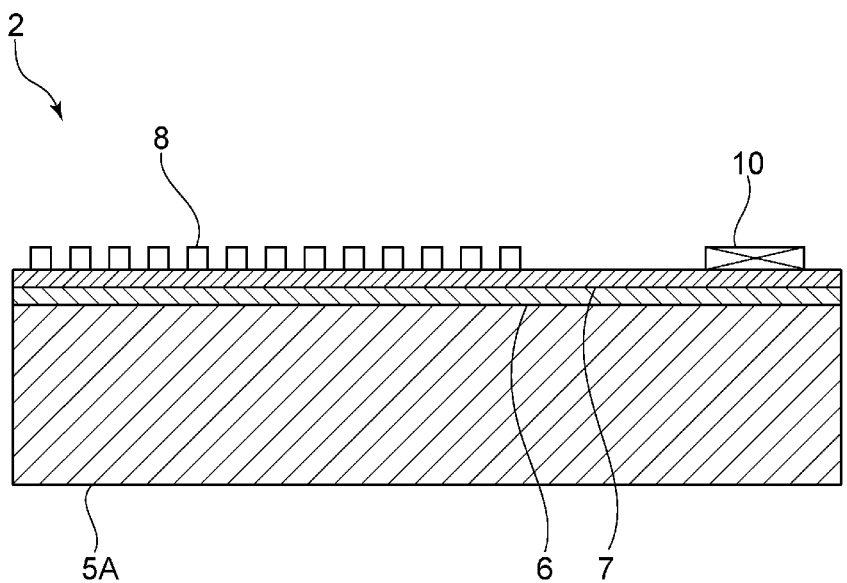
FIG. 14 is an elevational cross-sectional view that illustrates a modification of a SAW filter device according to a preferred embodiment of the present invention.

Although the high acoustic velocity film 5 defining a high acoustic velocity member is stacked on the support substrate 4 in the above-described preferred embodiments, a high acoustic velocity substrate 5A may be used instead of the support substrate 4, as illustrated in FIG. 14. Similarly to the high acoustic speed film 5, the high acoustic velocity substrate 5A is able to be made using an appropriate material where the acoustic velocity of a bulk wave is high.

As described above, a response of the fundamental wave of a SH wave is able to be ignored when the propagation orientation ψ at the comb capacitive electrode 10 is about 90°, for example.

Figure 15:
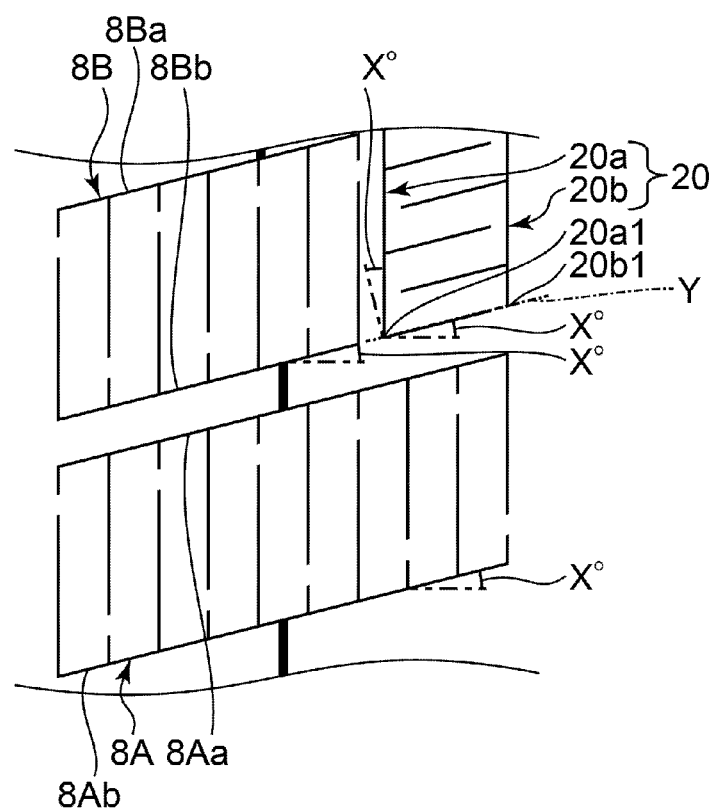
FIG. 15 is a partially cutout plan view that schematically illustrates an elastic wave filter device according to a preferred embodiment of the present invention.
Figure 16:
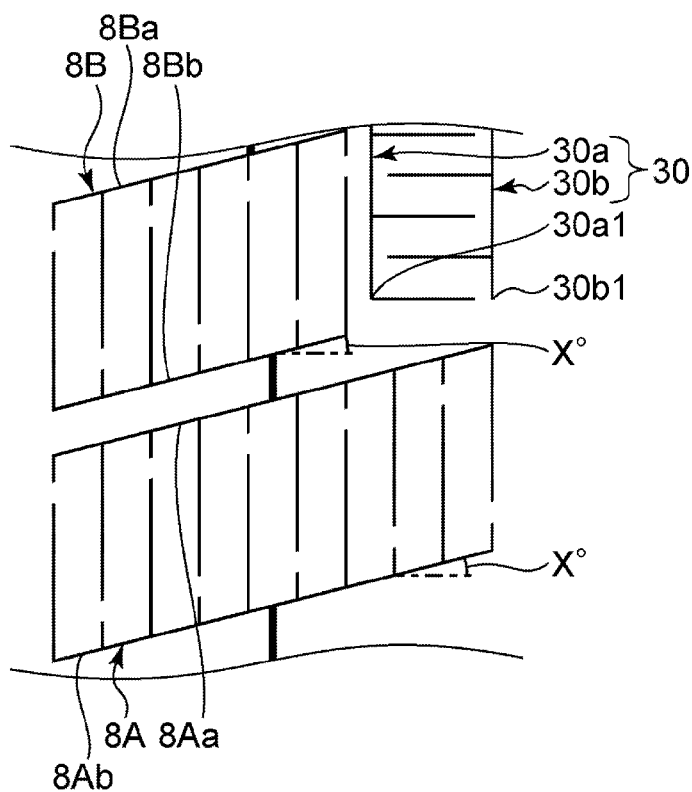
FIG. 16 is a partially cutout plan view that schematically illustrates an elastic wave filter device according to a comparative example.

FIG. 15 is a partially cutout plan view that schematically illustrates an elastic wave filter device according to another preferred embodiment of the present invention. FIG. 16 is a partially cutout plan view that schematically illustrates an elastic wave filter device according to a comparative example.

As illustrated in FIG. 15, the elastic wave filter device according to the present preferred embodiment includes a comb capacitive electrode 20, and first and second IDT electrodes 8A and 8B. The comb capacitive electrode 20 includes a pair of busbars 20a and 20b extending in parallel or substantially in parallel to each other. The first IDT electrode 8A is disposed at a gap from the comb capacitive electrode 20 in a direction in which the busbars 20a and 20b extend. The second IDT electrode 8B is arranged at a side of the comb capacitive electrode 20. The propagation direction of an elastic wave in the first and the second IDT electrodes 8A and 8B is a direction perpendicular or substantially perpendicular to a direction in which the busbars 20a and 20b of the comb capacitive electrode 20 extend.

The first IDT electrode 8A is connected to the second IDT electrode 8B. The first IDT electrode 8A includes a pair of busbars 8Aa and 8Ab extending in parallel or substantially in parallel to each other. The second IDT electrode 8B also includes a pair of busbars 8Ba and 8Bb extending in parallel or substantially in parallel to each other. The busbars 8Aa and 8Ab and the busbars 8Ba and 8Bb extend in parallel or substantially in parallel to each other.

In this case, the inclination angles of the IDT electrodes 8A and 8B are angles defined by the propagation direction of an elastic wave in the IDT electrodes 8A and 8B and the busbars 8Aa and 8Ab and the busbars 8Ba and 8bB. At this time, the inclination angles of the IDT electrodes 8A and 8B are X°. Similarly, the inclination angle of the comb capacitive electrode 20 is an angle defined by the propagation direction of an elastic wave generated by the comb capacitive electrode 20 and the busbars 20a and 20b. At this time, the inclination angle of the comb capacitive electrode 20 is also X°. That is, the propagation orientation ψ at the comb capacitive electrode 20 is about 90°+X°, for example. When the inclination angles of the IDT electrodes 8A and 8B are X°, there is no particular characteristic problem when the propagation orientation ψ at the comb capacitive electrode 20 is within the range of about (90°+X°)±5°, that is, within the range from about (90°+X°−5°) to about (90°+X°+5°) inclusive, for example. As has been described above, when ψ is within the range from about 86° to about 94° inclusive, for example, as described above, the band width ratio BW of the fundamental wave of a SH wave becomes less than or equal to about 0.01%, for example, which is further preferable.

Here, the busbar 20a includes an end portion 20a1 on the first IDT electrode 8A side. The busbar 20b includes an end portion 20b1 on the first IDT electrode 8A side. The end portion 20a1 and the end portion 20b1 are positioned on a virtual line Y tilted by the angle X° from a direction perpendicular or substantially perpendicular to a direction in which the busbars 20a and 20b extend. That is, the end portion 20a1 and the end portion 20b1 are positioned on a line extending in parallel or substantially in parallel to the busbar 8Aa of the IDT electrode 8A.

In contrast, in the elastic wave filter device according to the comparative example illustrated in FIG. 16, the configuration of a comb capacitive electrode 30 is different from the comb capacitive electrode 20 according to the present preferred embodiment. That is, the elastic wave propagation orientation ψ at the comb capacitive electrode 30 is about 90°, for example. More specifically, the busbars 30a and 30b of the comb capacitive electrode 30 extend in a direction perpendicular or substantially perpendicular to the propagation direction of an elastic wave in the first IDT electrodes 8A and 8B. The busbars 30a and 30b are not tilted with respect to the propagation direction of an elastic wave at the comb capacitive electrode 30. Note that the capacitance of the comb capacitive electrode 30 is the same or substantially the same as the capacitance of the comb capacitive electrode 20.

In the elastic wave filter device according to the comparative example, a distance between an end portion 30a1 of the busbar 30a of the comb capacitive electrode 30 and the first IDT electrode 8A is greater than a distance between an end portion 30b1 of the busbar 30b and the first IDT electrode 8A. Since the distance between the end portion 30a and the IDT electrode 8A is relatively long as has been described above, the area to arrange the first IDT electrodes 8A and 8B and the comb capacitive electrode 30 becomes greater.

In contrast, in the present preferred embodiment, since X° is the inclination angle of the first IDT electrode 8A, the propagation orientation ψ at the comb capacitive electrode 20 is about 90°+X°, for example. Thus, while having the same capacitance as the comb capacitive electrode 30, the comb capacitive electrode 20 is able to be disposed in such a manner that the end portion 20a1 and the end portion 20b1 are positioned on a line extending in parallel or substantially in parallel to the busbar 8Aa of the IDT electrode 8A. Thus, the distance between the end portion 20a1 and the IDT electrode 8A and the distance between the end portion 20b1 and the first IDT electrode 8A is able to be made equal or substantially equal. Therefore, the area to arrange the first and the second IDT electrodes 8A and 8B and the comb capacitive electrode 20 is able to be reduced without reducing the capacitance of the comb capacitive electrode 20.

Note that the busbars 20a and 20b of the comb capacitive electrode 20 need not extend in a direction perpendicular or substantially perpendicular to the propagation direction of an elastic wave in the first IDT electrode 8A.

Figure 17:
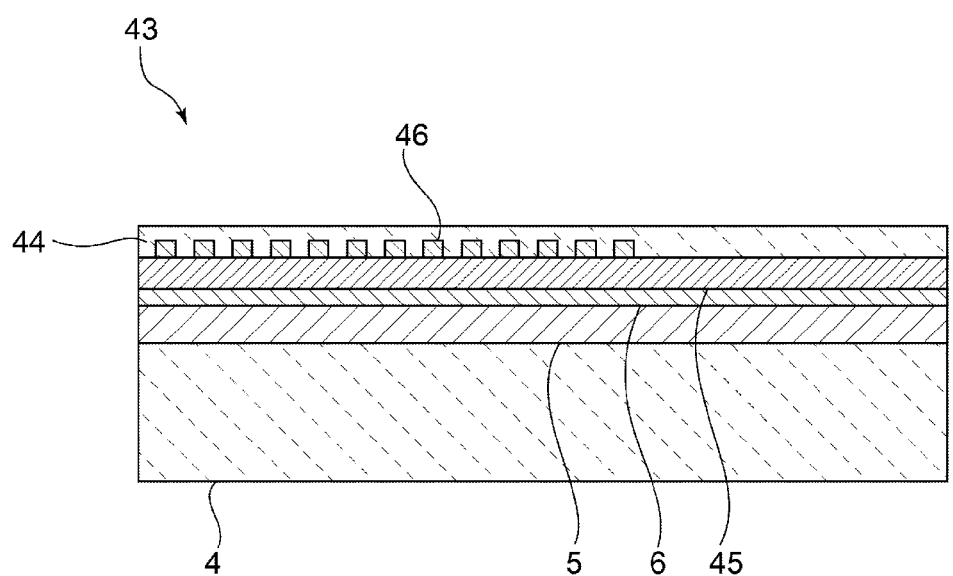
FIG. 17 is a schematic elevational cross-sectional view that illustrates a boundary acoustic wave device serving as a preferred embodiment of the present invention.

Although the SAW device has been described in each preferred embodiment described above, the present invention is applicable to other elastic wave devices, such as boundary acoustic wave devices, for example, and, even in such a case, achieve the same or similar advantageous effects. FIG. 17 is a schematic elevational cross-sectional view that illustrates a boundary acoustic wave device 43 according to a preferred embodiment of the present invention. To excite boundary acoustic waves, an IDT electrode 46 is provided on a boundary between a piezoelectric film 45 and a dielectric film 44 stacked on the piezoelectric film 45.

Figure 18:
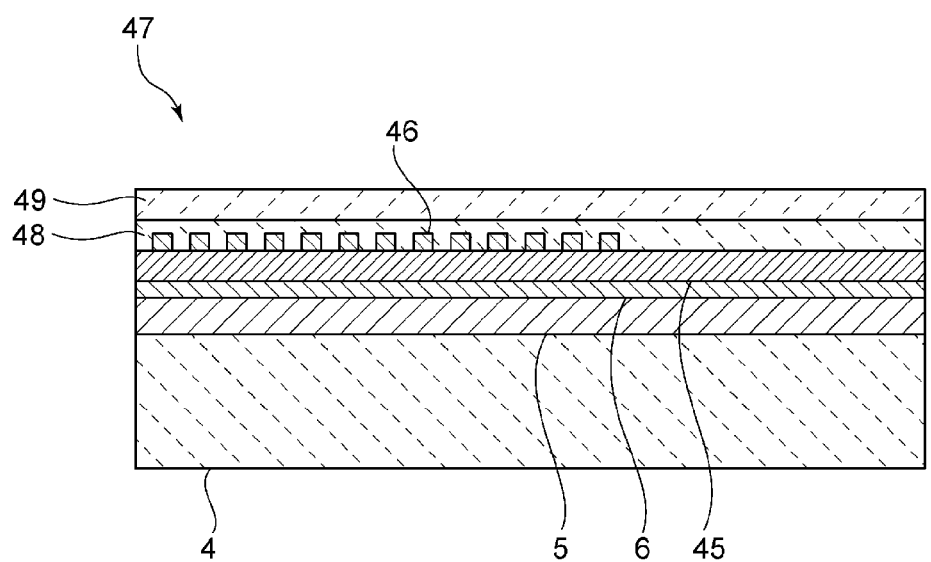
FIG. 18 is a schematic elevational cross-sectional view that illustrates a boundary acoustic wave device with a three-medium structure.

FIG. 18 is a schematic elevational cross-sectional view of a boundary acoustic wave device 47 with a three-medium structure. The IDT electrode 46 is provided on a boundary between the piezoelectric film 45 and a dielectric film 48. Furthermore, a dielectric member 49 is stacked on the dielectric film 48, and the dielectric member 49 has a higher transversal wave acoustic velocity than the dielectric film 48. Accordingly, the boundary acoustic wave device with a three-medium structure is provided.

A boundary acoustic wave device, such as the boundary acoustic wave devices 43 and 47, is able to achieve the same or similar advantageous effects as those achieved by the SAW filter device 2 according to the first preferred embodiment of the present invention described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
a high acoustic velocity member;
a low acoustic velocity film stacked on the high acoustic velocity member;
a piezoelectric film stacked on the low acoustic velocity film;
an IDT electrode provided on the piezoelectric film and defining a filter; and
a comb capacitive electrode provided on the piezoelectric film and electrically coupled to the filter; wherein
an acoustic velocity of a bulk wave propagating in the high acoustic velocity member is higher than an acoustic velocity of a bulk wave propagating in the piezoelectric film;
an acoustic velocity of a bulk wave propagating in the low acoustic velocity film is lower than an acoustic velocity of a bulk wave propagating in the piezoelectric film;
where $\lambda c$ is a wavelength determined by an electrode finger pitch of the comb capacitive electrode, and, among modes of an elastic wave generated by the comb capacitive electrode, $V_{C-(P+SV)}$ is an acoustic velocity of a P+SV wave, $V_{C-SH}$ is an acoustic velocity of a SH wave, and $V_{C-HO}$ is an acoustic velocity of, out of higher-order modes of a SH wave, a higher-order mode positioned at a lowest frequency side, $V_{C-(P+SV)} < V_{C-SH} < V_{C-HO}$; and
where $f_{F-L}$ is a cutoff frequency on a lower frequency side of the filter, $f_{F-H}$ is a cutoff frequency on a higher frequency side, and Euler angles (0°, θ, ψ) represent a propagation direction, with respect to a crystal of the piezoelectric film, of an elastic wave generated by the comb capacitive electrode, given any θ and ψ, $V_{C-(P+SH)}/\lambda_C < f_{F-L}$ and $V_{C-SH}/\lambda_C > f_{F-H}$, or $V_{C-SH}/\lambda_C < f_{F-L}$ and $V_{C-HO}/\lambda_C > f_{F-H}$.

2. The elastic wave filter device according to claim 1, wherein ψ of the Euler angles, the Euler angles being a propagation orientation of an elastic wave generated by the comb capacitive electrode, is within a range from about 86° to about 94° inclusive.

3. The elastic wave filter device according to claim 2, wherein $V_{C-(P+SV)}/\lambda_C < f_{F-L}$ and $V_{C-HO}/\lambda_C > f_{F-H}$.

4. The elastic wave filter device according to claim 1, wherein the high acoustic velocity member is a high acoustic velocity film, and the elastic wave filter device further comprises a support substrate with an upper surface on which the high acoustic velocity film is stacked.

5. The elastic wave filter device according to claim 1, wherein the high acoustic velocity member is made of a high acoustic velocity substrate.

6. The elastic wave filter device according to claim 1, wherein
the comb capacitive electrode includes a pair of busbars facing each other;
the IDT electrode includes a first IDT electrode spaced by a gap from the comb capacitive electrode in a direction in which the busbars extend;
the first IDT electrode includes a pair of busbars facing each other; and
where an inclination angle of the first IDT electrode is an angle defined by a propagation direction of an elastic wave in the first IDT electrode and the busbars, and X° is the inclination angle of the first IDT electrode, ψ of the Euler angles, the Euler angles being a propagation orientation of an elastic wave generated by the comb capacitive electrode, is within a range from about $(90°+X°-5°)$ to about $(90°+X°+5°)$ inclusive.

7. The elastic wave filter device according to claim 6, wherein the busbars of the comb capacitive electrode extend in a direction perpendicular or substantially perpendicular to the propagation direction of an elastic wave in the first IDT electrode.

8. The elastic wave filter device according to claim 6, wherein
the IDT electrode includes a second IDT electrode connected to the first IDT electrode, and the second IDT electrode includes a pair of busbars facing each other, the pair of busbars extending in a direction parallel or substantially parallel to the busbars of the first IDT electrode; and
the second IDT electrode is arranged at a side of the comb capacitive electrode.

9. The elastic wave filter device according to claim 1, wherein the high acoustic velocity film is made of AlN.

10. The elastic wave comb filter device according to claim 1, wherein the low acoustic velocity film is made of $SiO_2$.

11. The elastic wave filter device according to claim 1, wherein the piezoelectric film is made of a 50°-rotated Y cut $LiTaO_3$ film.

12. The elastic wave filter device according to claim 1, wherein the IDT electrode and the comb capacitive electrode are made of Al.

13. The elastic wave filter device according to claim 1, wherein 1.46 µm<$\lambda c$<2.70 µm.

14. The elastic wave filter device according to claim 1, wherein $\lambda c$=2.2 µm.

15. The elastic wave filter device according to claim 1, further comprising:
a dielectric film stacked on the piezoelectric film; wherein
the IDT electrode is provided on a boundary between the piezoelectric film and the dielectric film.

16. The elastic wave filter device according to claim 15, wherein a dielectric member is stacked on the dielectric film, and the dielectric member has a higher transversal wave acoustic velocity than the dielectric film.

* * * * *